United States Patent

Krauss et al.

[11] Patent Number: 5,902,640
[45] Date of Patent: May 11, 1999

[54] METHOD OF IMPROVING FIELD EMISSION CHARACTERISTICS OF DIAMOND THIN FILMS

[75] Inventors: Alan R. Krauss, Naperville; Dieter M. Gruen, Downer Grove, both of Ill.

[73] Assignee: The University of Chicago, Chicago, Ill.

[21] Appl. No.: 08/684,426

[22] Filed: Jul. 19, 1996

Related U.S. Application Data

[63] Continuation-in-part of application No. 08/143,866, Oct. 19, 1993, Pat. No. 5,620,512, which is a continuation-in-part of application No. 08/035,419, Mar. 23, 1993, Pat. No. 5,370,855, which is a continuation-in-part of application No. 07/797,590, Nov. 25, 1991, Pat. No. 5,209,916.

[51] Int. Cl.⁶ .................................................. C23C 16/26
[52] U.S. Cl. ............................. 427/249; 427/77; 427/78; 427/377; 427/398.4
[58] Field of Search ..................... 427/249, 577, 427/78, 77, 377, 398.4

[56] References Cited

U.S. PATENT DOCUMENTS

| | | | |
|---|---|---|---|
| 4,414,176 | 11/1983 | Krauss et al. .......................... 376/136 |
| 4,494,965 | 1/1985 | Ali-Khan et al. .......................... 55/16 |
| 5,064,627 | 11/1991 | Zwart et al. .......................... 423/248 |
| 5,108,779 | 4/1992 | Gasworth .......................... 427/39 |
| 5,110,579 | 5/1992 | Anthony et al. .......................... 423/446 |
| 5,451,430 | 9/1995 | Anthony et al. ...................... 427/372.2 |
| 5,571,603 | 11/1996 | Utumi et al. .............................. 428/212 |
| 5,580,380 | 12/1996 | Liu et al. .................................. 117/86 |

FOREIGN PATENT DOCUMENTS 546752   6/1993   European Pat. Off. .

OTHER PUBLICATIONS

Article "Effects of Potassium and Lithium Metal Deposition on the Emission Characteristics of Spindt–type Thin–film Field Emission Microcathode Arrays", Talin, A.A., T.E. Feller and D.J. Devine, J. Vac. Sci. Technol. B., vol. 13, No. 2 (Mar./Apr. 1995).

Article "Beyond AMLCDs: Field Emission Displays?", Derbyshire, K., Solid State Technology (Nov. 1994) pp. 55–65.

*Primary Examiner*—Shrive Beck
*Assistant Examiner*—Timothy Meeks
*Attorney, Agent, or Firm*—Emrich & Dithmar

[57] ABSTRACT

A method of preparing diamond thin films with improved field emission properties. The method includes preparing a diamond thin film on a substrate, such as Mo, W, Si and Ni. An atmosphere of hydrogen (molecular or atomic) can be provided above the already deposited film to form absorbed hydrogen to reduce the work function and enhance field emission properties of the diamond film. In addition, hydrogen can be absorbed on intergranular surfaces to enhance electrical conductivity of the diamond film. The treated diamond film can be part of a microtip array in a flat panel display.

15 Claims, 2 Drawing Sheets

METHOD OF IMPROVING FIELD EMISSION CHARACTERISTICS OF DIAMOND THIN FILMS

This application is a continuation-in-part of Ser. No. 143,866 filed Oct. 27, 1993, now U.S. Pat. No. 5,620,512, which is a continuation-in-part of Ser. No. 35,419, filed Mar. 23, 1993, now U.S. Pat. No. 5,370,855, which is a continuation-in-part of Ser. No. 797,590 filed Nov. 25, 1991, now U.S. Pat. No. 5,209,916.

This invention was made with Government support under contract No. W-31-109-ENG-38 between the University of Chicago and the U.S. Department of Energy. The Government has certain rights in this invention.

The present invention is concerned generally with a system and method for making thin diamond films having improved field emission characteristics. More particularly, the invention is concerned with a system and method of improving field emission characteristics of diamond thin films by providing a source of hydrogen molecules or atomic hydrogen for promoting hydrogen adsorption onto a diamond film either being manufactured or being used as a field emitter. The hydrogen adsorbed onto the exposed diamond film surface acts to lower the work function and thus improve emission. The hydrogen further enables establishing high conductivity paths along diamond grain boundaries.

There is a substantial effort underway to manufacture field emission flat panel devices for use in computer displays and instrument readouts. Such displays use a matrix-addressed phosphor screen readout and are capable of much higher brightness, higher energy efficiency and better readability than the currently used liquid crystal displays. Operation of a field emission display requires a cold cathode electron source in which the emission current can be controlled by the application of voltages on row and column electrodes. A cold cathode electron source consists of an electron emitting material, configured either as a smooth surface or as an array of sharp tips which enhance the local electric field and result in electron emission at lower voltages than the smooth surface. The electron emitting material can be used either in bulk form or as a thin film on a smooth or deliberately textured surface. Microtip arrays are typically made of either silicon or a refractory metal, such as Mo. The tips, however, are subject to blunting as a result of prolonged electron emission.

Furthermore, diamond is one of the best thermal conductors known, with a thermal conductivity approximately five times higher than that of copper, and also, in some forms, acts as an efficient electron emitter. Diamond film coatings on a microtip array, therefore, distribute the thermal load, permitting higher emission currents without tip blunting, and can permit reduced voltage operation on either smooth surface emitters or microtip arrays. However, diamond is an excellent electrical insulator, and in order to function effectively as an electron emitting material, it is necessary to provide conducting paths from the substrate to the surface of the diamond. These conducting paths can be produced either by (1) degrading the overall quality of the diamond, (2) creating intersecting graphitic or amorphous carbon paths around the diamond grains, or (3) modifying the diamond grain boundaries by, for example, hydrogen diffusion so that there is an extremely thin conducting layer on the surface of the diamond grains. This latter approach also results in hydrogen termination of the free diamond surface, thereby decreasing the work function and increasing the emission current for a given applied voltage.

It is, therefore, an object of the invention to provide an improved article and method of manufacture of a field emission material with desirable electrical conductivity and lowered work function.

It is another object of the invention to provide a novel article and method of manufacture of a nanocrystalline diamond film for use as a field emission material.

It is a further object of the invention to provide an improved article and method of manufacture of a nanocrystalline diamond film with surface terminated hydrogen bonds for use as a field emission material.

It is an additional object of the invention to provide a novel article and method of manufacture of a diamond film having a hydrogen gas atmosphere maintained above the film by a hydrogen source.

It is also an object of the invention to provide an improved article and method of manufacture of a diamond film having surface terminated hydrogen atom bonds provided by atomic hydrogen produced in a chamber with an electrically heated filament in a hydrogen gas atmosphere disposed in communication with a volume containing the diamond film.

It is yet another object of the invention to provide a novel article and method of manufacture for diamond films having a lowered work function for field emission microtips.

It is also an additional object of the invention to provide an improved article and method of manufacture for diamond films with hydrogen bonded surface states using metal alloy hydrides to generate a controlled, continuous supply of hydrogen gas above the film.

It is yet a further object of the invention to provide a novel article and method of manufacture of nanocrystalline diamond films with controlled amounts of intergranular hydrogen to adjust electronic conduction in the diamond film.

These and other objects of the invention will be described in detail in the description provided hereinbelow and taken in conjunction with the drawings described below.

DETAILED DESCRIPTION OF PREFERRED EMBODIMENTS

Figure 1:
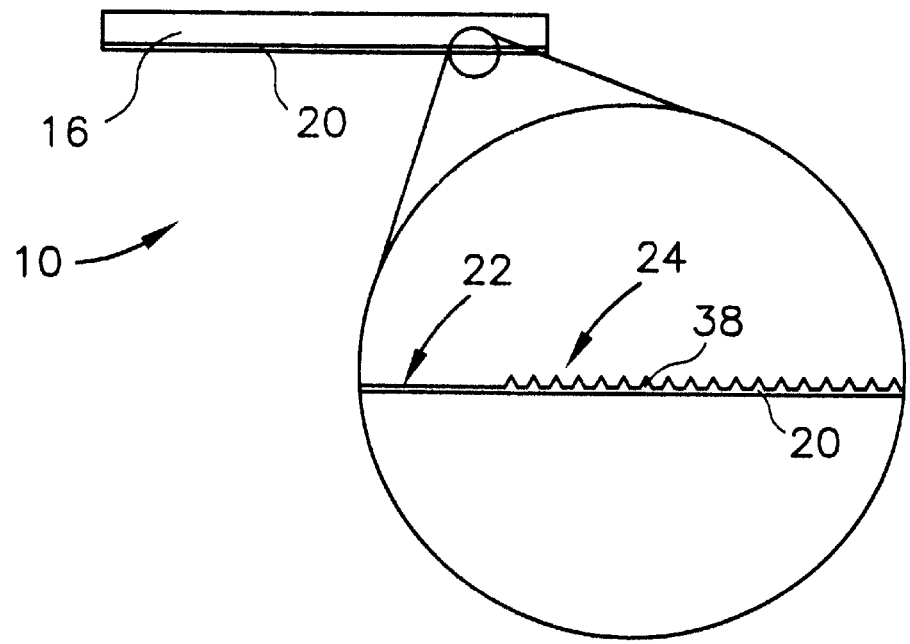
FIG. 1 illustrates a flat panel display system including an enclosed, hydrogen gas ambient to promote hydrogen adsorption by a diamond film of a flat panel display.

A typical diode field emission flat panel display 10 is depicted in the figures. In particular, in FIG. 1, cathode material 20 is present either as a diamond film on a smooth surface 22 or as a diamond coating on a microtip array 24. The preferred substrate 16 for the diamond film can be W, Mo, Si and Ni. A hydrogen gas ambient above the diamond film can be provided by sealing the display 10 after providing the hydrogen gas atmosphere.

Figure 2:
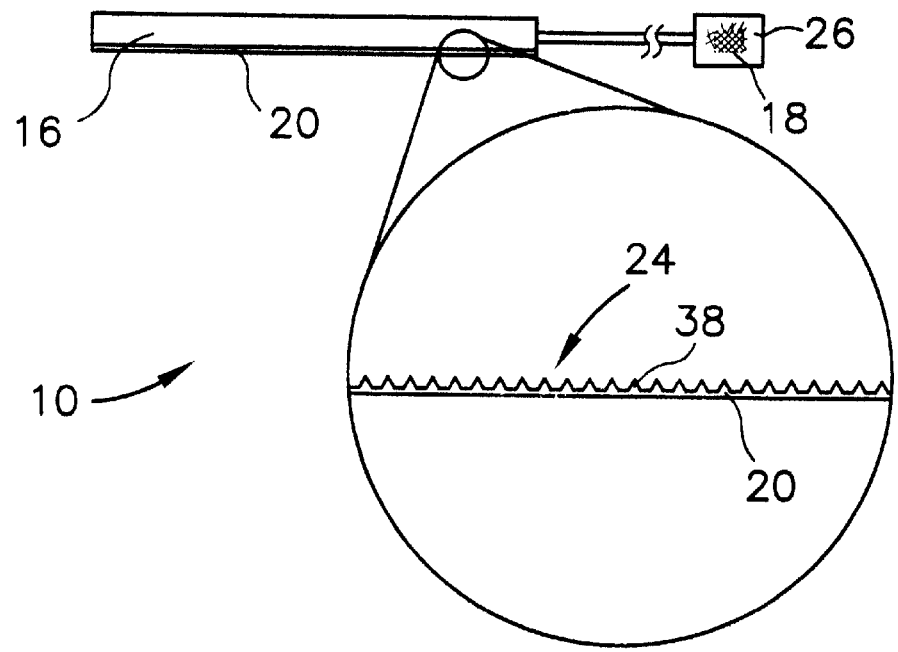
FIG. 2 illustrates another system for providing hydrogen gas from a source for adsorption by a diamond film of a flat panel display.

In another embodiment shown in FIG. 2, the hydrogen gas ambient can be provided by an attached chamber 26 coupled to the flat panel display 10. The attached chamber 26 can include a metal hydride and/or getter material 18 which can be activated after assembly. The hydride can be a rare earth metal hydride, for example, $LaNi_{5-x}AL_xH_y$, wherein X is $0 \leq x \leq 5$. Such hydrides allow the user to vary the hydrogen equilibrium pressure over a wide pressure range using different metal hydrides. In general, the stoichiometry of any such hydride can be varied to allow further control of hydrogen pressure. To obtain very low hydrogen pressures, one can use substantially pure La metal or a hydrogen getter material, such as ZrAl alloys. Depending on the desired hydrogen pressure which is optimal, a particular hydrogen pressure can thus be maintained above the diamond film.

Figure 3:
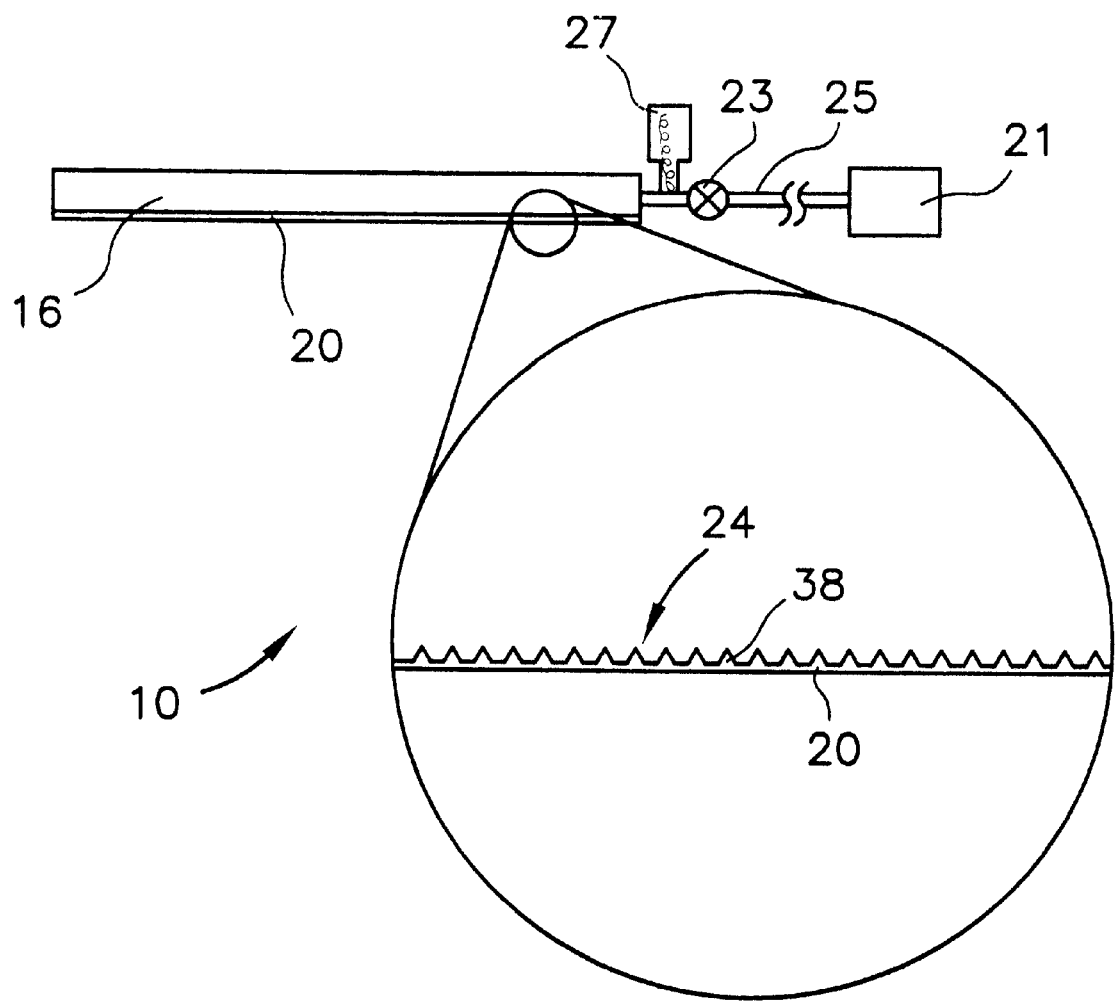
FIG. 3 illustrates the use of an external source of molecular hydrogen and the additional use of a heated filament to promote the formation of atomic hydrogen for adsorption onto diamond.

In another embodiment, shown in FIG. 3, the hydrogen atmosphere can be provided by at least one of (1) an external hydrogen source 21 with a gas valve 23 in line 25 attached to the flat panel display 10, or (2) an electrically heated filament 27 disposed either in the incoming hydrogen gas stream or near the diamond surface enclosed within the display 10 to promote the formation of atomic hydrogen for more efficient surface adsorption of hydrogen and enhanced grain boundary hydrogen diffusion.

The presence of a controlled hydrogen atmosphere permits establishing a selected, particular level of hydrogen bonds to the dangling carbon bonds at the surface of the diamond film. The presence of these hydrogen bonds reduces the work function for the diamond, increasing the emission current density and/or allowing lower voltage operation, thereby enabling use as an effective electron source for the flat panel display 16. The previously described metal alloy hydride source can be particularly advantageous since it will maintain a substantially constant pressure, enabling replacement of hydrogen desorbed during active electron emission operation. Such hydride sources also do not present a substantial hazard which a pressurized hydrogen gas source might.

A field emission microtip 38 has a diamond thin film overlayer which will have a much longer lifetime and, as a consequence of the reduced work function and enhanced electrical conductivity, can function virtually indefinitely in the flat matrix display 16.

The invention also includes a method of preparing diamond thin films comprising the steps of providing a hydrogen atmosphere to a sealed chamber containing a substrate and depositing a diamond film on the substrate in the presence of hydrogen at a substrate temperature which is low enough to permit the incorporation of hydrogen into the growing film, thereby absorbing hydrogen onto the intergrandular surfaces of the diamond film.

The invention also includes the method where the hydrogen above the diamond film is provided after the deposition of the film, thereby forming and replenishing hydrogen bonds with surface carbon atoms of the diamond film as hydrogen is desorbed during electron emission.

The invention further includes the method as previously set forth wherein a heated metal filament is incorporated into the chamber to promote the adsorption of atomic hydrogen on the film.

The invention further includes the method as previously described wherein the hydrogen atmosphere is provided by at least one providing hydrogen from (a) an external valved hydrogen gas source, (b) a reversible hydrogen getter such as a rare earth hydride material, or (c) a hydrogen gas atmosphere in the sealed gas chamber.

While preferred embodiments of the invention have been shown and described, it will be clear to those skilled in the art that various changes and modifications can be made without departing from the invention in its broader aspects as set forth in the claims provided hereinafter.

What is claimed is:

1. A method of replenishing terminal hydrogens in a hydrogen-terminated diamond thin films during use as a field emission device, comprising the steps of:

depositing a diamond film on a substrate;

providing a sealed chamber containing the diamond film, coupling the diamond film to a cold cathode source to form a field emission device for use as a display; and maintaining an atmosphere of hydrogen above the diamond film without any further diamond film deposition, whereby during desorption of hydrogen from surface carbon atoms during field emission when the diamond film is used as a display, the hydrogen in the atmosphere in the sealed chamber replenishes the hydrogen desorbed during said use.

2. The method as defined in claim 1 wherein the step of maintaining the hydrogen atmosphere comprises activating an electrically heated filament in the hydrogen atmosphere to form atomic hydrogen.

3. The method as defined in claim 1 wherein said step of maintaining an atmosphere of hydrogen comprises providing a source of hydrogen gas coupled to a sealed chamber containing the diamond film.

4. The method as defined in claim 3 wherein said step of maintaining an atmosphere of hydrogen comprises providing a metal hydride to maintain a hydrogen gas pressure above the diamond film.

5. The method as defined in claim 4 wherein the metal hydride consists essentially of a rare earth hydride.

6. The method as defined in claim 4 wherein the rare earth hydride consists essentially of $LaNi_{5-x}AL_x$, wherein X is $0 \leq x \leq 5$.

7. The method as defined in claim 3 further including providing a hydrogen getter material in said chamber coupled to the hydrogen atmosphere to control hydrogen gas pressure in said chamber.

8. The method as defined in claim 3 wherein said step of maintaining an atmosphere of hydrogen comprises providing a pressurized source of hydrogen gas.

9. The method as defined in claim 1 further including the step of bonding the hydrogen to surface carbon atoms of the diamond film, thereby enhancing electron emission from the diamond film during said use.

10. The method as defined in claim 9 wherein the hydrogen is selected from the group consisting of atomic hydrogen and molecular hydrogen.

11. The method as defined in claim 1 wherein said substrate is selected from the group consisting of W, Mo, Si and Ni.

12. A method of preparing diamond thin films for use as field emission devices in a display, comprising the steps of:

providing a hydrogen atmosphere to a sealed chamber containing a substrate;

depositing a diamond thin film on the substrate in the presence of the hydrogen at a substrate temperature which is low enough to permit the incorporation of hydrogen into the film during deposition, thereby adsorbing hydrogen onto intergranular surfaces of the diamond film;

coupling the diamond film to a cold cathode source to form a field emission device for use as a display; and maintaining an atmosphere of hydrogen above the diamond film without any further diamond film deposition, whereby during desorption of hydrogen from surface carbon atoms during field emission when the diamond film is used as a display, the hydrogen in the atmosphere in the sealed chamber replenishes the hydrogen desorbed during said use.

13. The method as defined in claim 12 further including the step of providing hydrogen above the diamond film after deposition of the film, thereby forming and replenishing hydrogen bonds with surface carbon atoms of the diamond film as hydrogen is desorbed during electron emission when the diamond thin film is in use as a field emitter in a flat panel display.

14. The method as defined in claim 12 further including the step of incorporating a heated metal filament in said chamber to promote the adsorption of atomic hydrogen on the diamond film.

15. The method as defined in claim 12, wherein the step of providing a hydrogen atmosphere comprises at least one of providing hydrogen from (a) an external valved hydrogen gas source, or (b) a rare earth hydride material.

* * * * *